United States Patent
Izzo

(10) Patent No.: US 6,827,583 B2
(45) Date of Patent: Dec. 7, 2004

(54) ELECTRONIC CONNECTION SYSTEM

(75) Inventor: Vincent Izzo, Jamison, PA (US)

(73) Assignee: General Instrument Corporation, Horsham, PA (US)

( * ) Notice: Subject to any disclaimer, the term of this patent is extended or adjusted under 35 U.S.C. 154(b) by 0 days.

(21) Appl. No.: 09/952,695

(22) Filed: Sep. 14, 2001

(65) Prior Publication Data

US 2002/0123249 A1 Sep. 5, 2002

Related U.S. Application Data

(60) Provisional application No. 60/233,330, filed on Sep. 18, 2000.

(51) Int. Cl.$^7$ ................................................ H01R 9/09
(52) U.S. Cl. ........................................ 439/61; 361/752
(58) Field of Search ................................ 361/752, 753, 361/759, 788, 796, 797; 439/61, 374

(56) References Cited

U.S. PATENT DOCUMENTS

| | | | | |
|---|---|---|---|---|
| 4,301,494 A | * | 11/1981 | Jordan | 361/798 |
| 5,388,995 A | * | 2/1995 | Rudy et al. | 439/61 |
| 5,680,295 A | * | 10/1997 | Le et al. | 361/695 |
| 5,848,906 A | * | 12/1998 | Glusker et al. | 439/157 |
| 5,995,376 A | * | 11/1999 | Schultz et al. | 361/788 |
| 6,195,493 B1 | * | 2/2001 | Bridges | 385/134 |
| 6,239,984 B1 | * | 5/2001 | Koradia et al. | 361/784 |
| 6,419,499 B1 | * | 7/2002 | Bundza | 439/61 |

* cited by examiner

Primary Examiner—Thanh-Tam Le
(74) Attorney, Agent, or Firm—Volpe and Koenig, P.C.

(57) ABSTRACT

An electronic connection system including a chassis defining at least one tray having a mechanical coupling. A high speed backplane is positioned on the chassis. A tray supports an electrical device such that the tray is engageable with the mechanical coupling to align a tray electrical connector to engage the backplane when the tray is fully engaged with the at least one tray receiving port to establish electrical communication between the electrical device and the high speed backplane. The mechanical coupling provides a structural connection to the chassis for the tray.

17 Claims, 3 Drawing Sheets

FIG. 1    10'    PRIOR ART

ELECTRONIC CONNECTION SYSTEM

CROSS-REFERENCE TO RELATED APPLICATION

This application claims the benefit of U.S. Provisional Patent Application No. 60/233,330, filed Sep. 18, 2000, entitled "High Speed Backplane Extension to Structured Wiring Connection and Control Center" which is hereby incorporated by reference herein in its entirety as if fully set forth.

BACKGROUND

The present invention is directed to electronic connection centers for computer networks and, more specifically, to the combination of a high speed backplane and an electronic connection system.

Referring to FIG. 1, electronic connection systems 10' typically provide for the mechanical mounting of multiple electronic devices 16' and provide an interface between various devices 16' and a computer network. Typical electronic connection systems 10' use wiring 11' to interconnect the electronic devices 16' to a patch panel 46' which is connected to the rest of the network via ribbon wires 48'. However, wires 11' fail to provide optimum signal transmission for broad band modems, high speed digital storage devices, home telemetry, caching servers and a host of other high speed devices.

BRIEF DESCRIPTION OF THE DRAWINGS

The present invention will hereinafter be described in conjunction with the appended drawing figures, wherein like numerals denote like elements, and.

DETAILED DESCRIPTION OF THE PREFERRED EMBODIMENT

The ensuing detailed description provides preferred exemplary embodiments only and is not intended to limit the scope, applicability, or configuration of the invention. Rather, the ensuing detailed description of the preferred exemplary embodiment will provide those skilled in the art with an enabling description for implementing the preferred exemplary embodiment of the invention. It is understood that various changes may be made in the function and arrangement of elements without departing from the spirit and scope of the invention as set forth in the appended claims.

Figure 1:
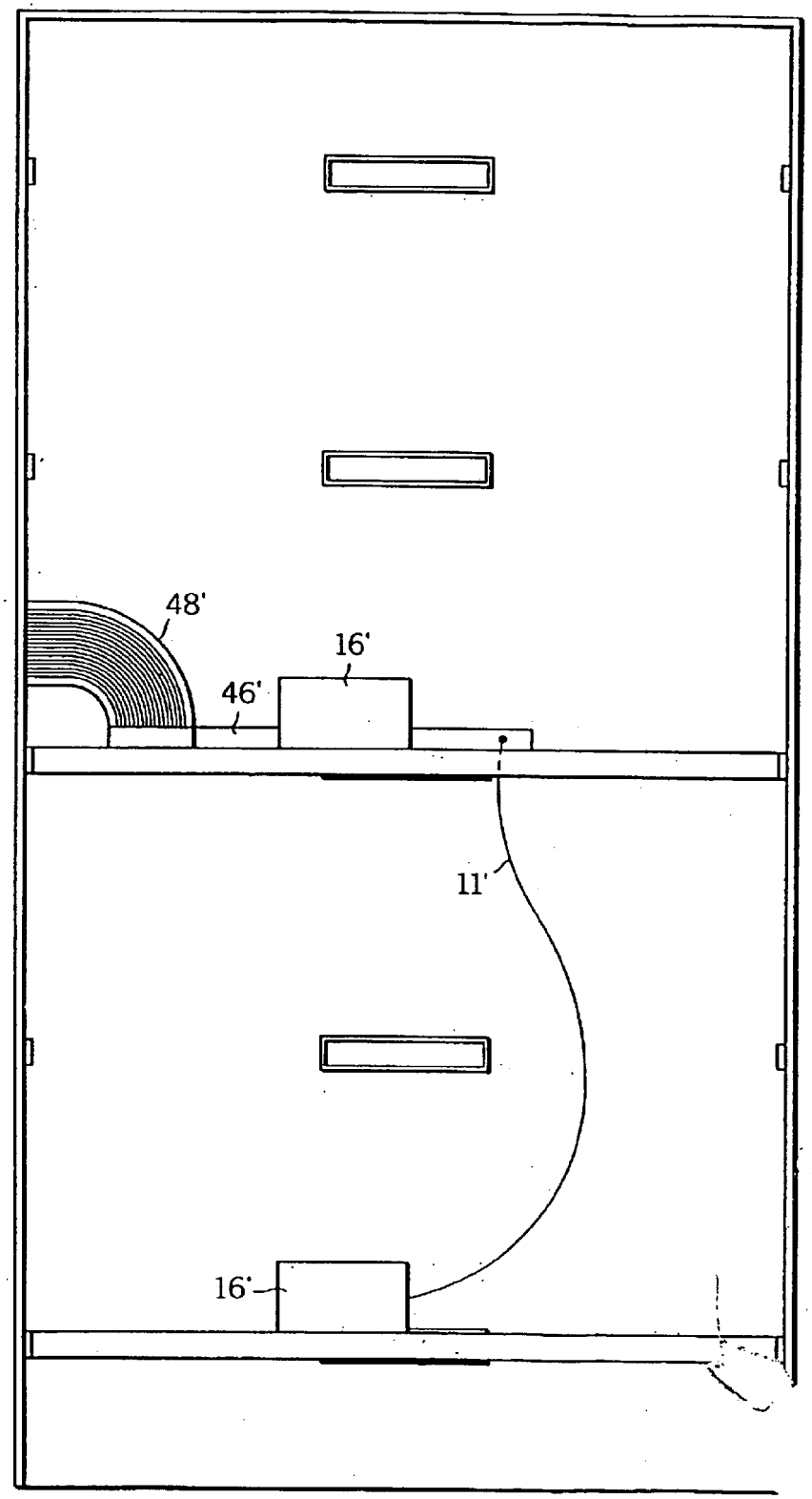
FIG. 1 is a front elevational view of a prior art electronic connection system.
Figure 2:
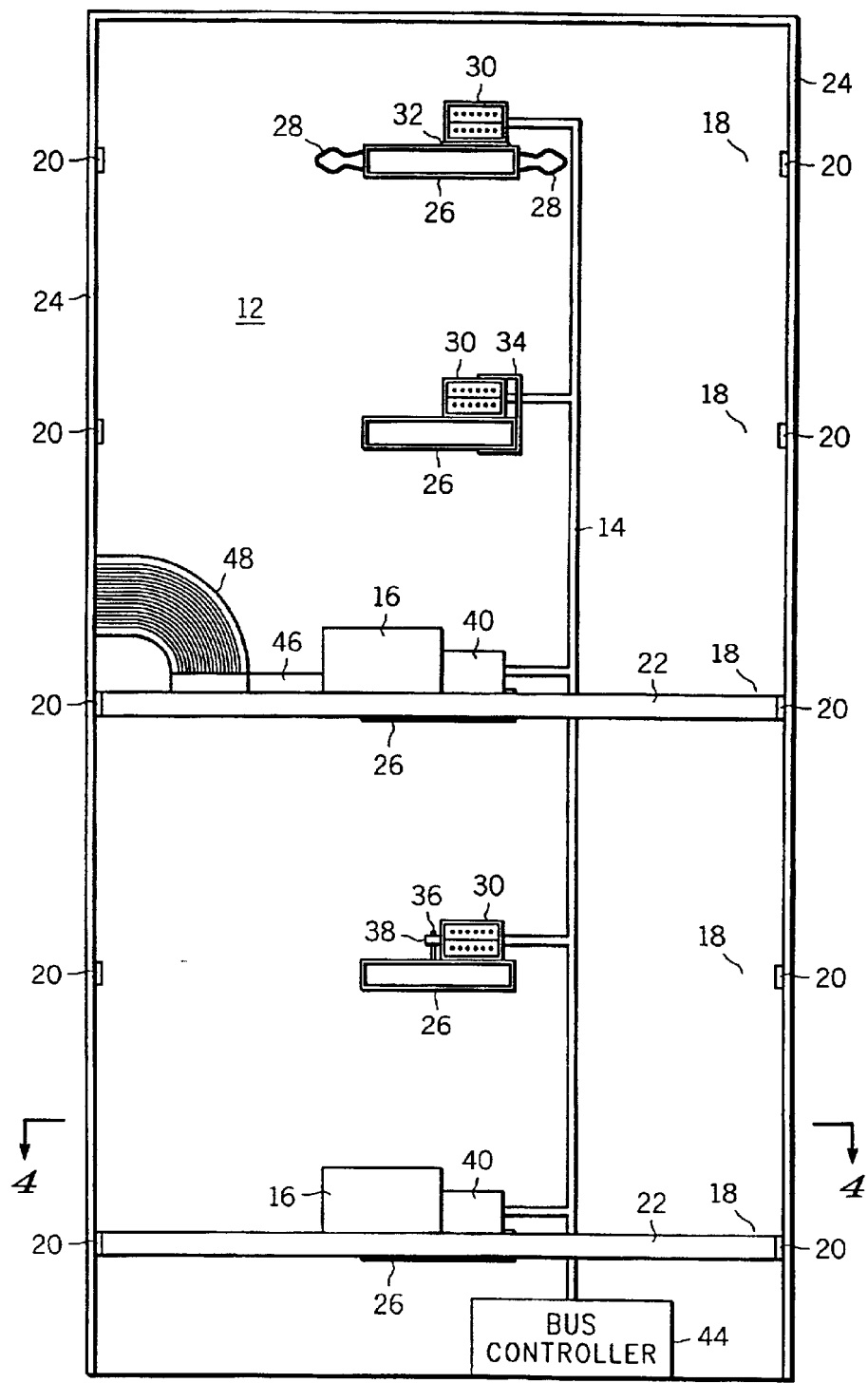
FIG. 2 is a front elevational view of an electronic connection system according to the present invention.

Referring to FIG. 2, an electronic connection system 10 according to the present invention is shown. While it is preferred that the electronic connection system 10 be manufactured with a high speed backplane 14 (further described below), those of ordinary skill in the art will appreciate from this disclosure that the electronic connection system 10 can be manufactured without the backplane 14. Instead, a retrofitting process can be used to add the high speed backplane 14 to the electronic connection system 10. Thus, the present invention allows for the retrofitting of preexisting electronic connection systems 10' to include the high speed backplane 14. The use of a retrofitting process allows current manufacturing processes to be efficiently modified to produce the electronic connection system 10 of the present invention without having to undergo extensive retooling of preexisting assembly lines.

The electronic connection system 10 preferably includes a chassis 12 which defines at least one tray receiving port 18. It is preferred that the chassis be manufactured of a generally rigid, strong, durable material, such as steel, aluminum, a suitable polymer or the like. While it is preferred that the chassis 12 have a generally rectangular, tower-like configuration, those of ordinary skill in the art will appreciate from this disclosure that the chassis 12 can have the configuration of a conventional desktop computer housing or the like without departing from the scope of the present invention. Alternatively, the chassis 12 can have an oblong shape, irregular shape or the like without departing from the scope of the present invention.

The tray receiving ports 18 each preferably include guide rails 20 for slidably receiving an electronic device supporting tray 22. While it is preferred that the tray receiving ports 18 use guide rails 20 to receive the trays 22, those of ordinary skill in the art will appreciate from this disclosure that any known means of mounting the tray 22 within a corresponding tray receiving port 18, such as sliding the tray 22 into grooves (not shown) in the lateral sidewalls 24 of the chassis 12, can be used without departing from the scope of the present invention.

Figure 3:
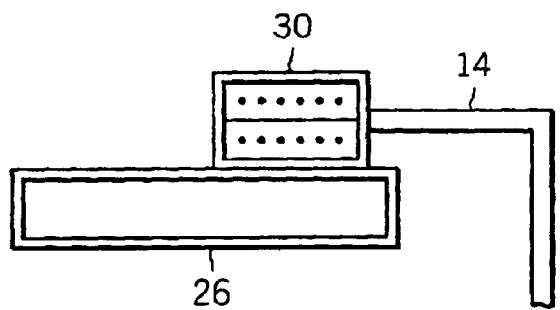
FIG. 3 is a partial front elevational view of the electronic connection system of FIG. 2 illustrating a backplane electrical connector disposed on a mechanical coupling.
Figure 4:
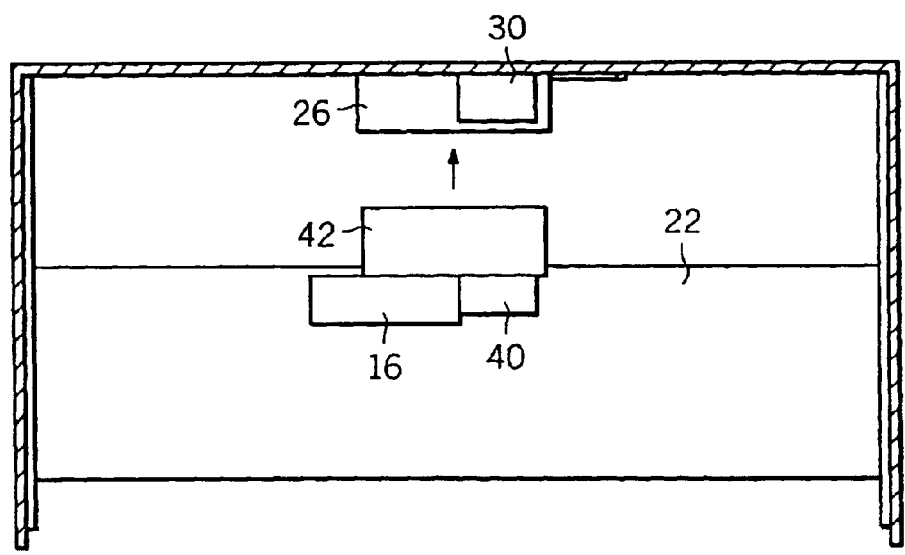
FIG. 4 is a cross-sectional view of the electronic connection system of FIG. 2 as taken along the lines 4—4 of FIG. 2 illustrating an electronic device supporting tray aligned, but not engaged, with the backplane electrical connector.

Referring to FIGS. 2–4, it is preferred that each tray receiving port 18 include a mechanical coupling 26. When the present invention uses a retrofitting process to add the highspeed backplane 14 to the electronic connection system 10, it is preferred, but not necessary, that the mechanical coupling 26 be formed from a preexisting electrical connector. Examples of suitable pre-existing electrical connectors for use as a mechanical coupling 26 are those connecters used to engage modem cards and various multi-pin connectors used to electrically communicate with computer peripherals or the like.

It is preferred, but not necessary, that the mechanical coupling 26 include a strain relief clip 28. Referring to FIG. 2, the strain relief clip 28 is preferably formed from a shaped piece of flexible material, or wire, that is capable of snapping into place within a tray cut-out (not shown) to interlock the tray 22 with the mechanical coupling 26. Alternatively, the strain relief clip 28 can engage a tray mechanical connector (further described below) 42 without departing from the scope of the present invention. Those of ordinary skill in the art will appreciate from this disclosure that fasteners (not shown) can be used to secure the tray 22 to the mechanical coupling 26 without departing from the scope of the present invention.

Referring again to FIG. 2, the high speed backplane 14 is preferably positioned on the chassis 12 and is capable of connecting various electrical devices 16 that are mounted within the electronic connection center 10. The use of the high speed backplane 14, as opposed to wires, to interconnect electrical devices 16 improves signal transfer and provides improved performance of the corresponding computer network when using broadband modems, high speed digital storage devices, telemetry systems, caching and other high speed signal transfer applications. While it is preferred that the high speed back plane 14 extend generally linearly along the chassis 12, those of ordinary skill in the art will appreciate from this disclosure that the high speed backplane 14 can be positioned along the chassis 12 in any configuration depending upon various manufacturing and design considerations without departing from the scope of the present invention.

Referring to FIGS. 2–4, a backplane electrical connector 30 is electrically attached to the high speed backplane 14. The backplane electrical connector 30 is preferably, but not necessarily, attached to the mechanical coupling 26. It is preferred that the high speed backplane 14 is physically connected to the backplane electrical connector 30 such that the high speed backplane 14 is supported on the chassis 12 by the engagement between the backplane electrical connector 30 and the mechanical coupling 26. This method of attaching the high speed backplane 14 to the chassis 12, allows for simplified retrofitting of a preexisting electronic connection system 10'. This simplified retrofitting allows manufacturers to use conventional assembly lines to produce wired electronic connection systems 10' that can be retrofitted to include a high speed backplane 14 by attaching backplane electrical connectors 30 to mechanical couplings 26 formed from preexisting electrical connectors. Thus, the electronic connection systems 10 of the present invention can be produced without costly retooling of assembly lines while taking advantage of the improved performance made possible by the incorporation of the high speed backplane 14 into the electronic connection system 10.

A first preferred method of securing the backplane electrical connector 30 to the mechanical coupling 26 uses an adhesive 32. It is preferable that the adhesive have suitable non-conductive, heat resistant properties as is understood by those of skill in the art. A second preferred method of attaching the backplane electrical connector 30 to the mechanical coupling 26 uses a clip 34. The clip 34 can be a C-shaped clip, a band of elastomeric material, or any other known type of clip capable of maintaining the backplane electrical connector 30 in contact with the mechanical coupling 26. A third preferred method of securing the backplane electrical connector 30 to the mechanical coupling 26 uses a fastener 36. The fastener 36 preferably extends through a portion 38 of the backplane electrical connector 30 and into the mechanical coupling 26 to secure the backplane electrical connector 30 thereon.

Alternatively, the backplane electrical connector 30 can be disposed on the mechanical coupling 26 and secured to the chassis 12 rather than to the mechanical coupling 26. The backplane electrical connector 30 can be secured to the chassis 12 using any of the above-described methods for securing the backplane electrical connector 30 to the mechanical coupling 26. For example, a clip (not shown) can be used to secure the backplane electrical connector 30 to a post (not shown) or cutout (not shown) in the chassis 12.

Referring to FIGS. 2 and 4, the tray 22 preferably supports the electrical device 16 and a tray electrical connector 40. The tray electrical connector 40 is compatible with the backplane electrical connector 30 and is electrically connected to the electrical device 16. The tray 22 is engageable with the mechanical coupling 26 to align the tray electrical connector 40 to electrically engage the backplane electrical connector 30 when the tray 22 is fully engaged with the at least one tray receiving port 18 to establish electrical communication between the electrical device 16 and the high speed backplane 14. Thus, the mechanical coupling 26 provides a structural connection to the chassis 12 for the tray 22 and the backplane electrical connector 30 provides an electrical connection for the device 16 supported on the tray 22. It is preferred, but not necessary, that the tray 22 include a tray mechanical connector 42 that is engageable with the mechanical coupling 26. The tray mechanical connector 42 allows for a more secure structural connection between the chassis 12 and the tray 22. However, those of ordinary skill in the art will appreciate from this disclosure that the tray 22 can include cut-outs configured to create an interference fit with the mechanical coupling 26 to provide the desired structural connection therebetween.

Data is preferably transferred from the various electrical devices 16 through the high speed backplane 14 to a patch panel 46. The patch panel 46 is preferably, but not necessarily, connected to the computer network via ribbon wires 48. Those of ordinary skill in the art will appreciate from this disclosure that the patch panel 46 can be attached to the computer network via individual wires, cables, fiber connectivity, data bus connections, or via wireless or the like without departing from the scope of the present invention.

As shown in FIG. 2, it is preferable, but not necessary, that a controller 44 be electrically attached to the high speed backplane 14. Those of ordinary skill in the art will appreciate from this disclosure that the preferred controller 44 is a high speed data networking bus capable of using an architecture consistent with the high speed buses generally used in personal computers and data communication devices. The bus 44 provides a common data path for all of the electronic devices 16 mounted on the chassis 12. It is preferred that the bus 44 be self organizing and that each electronic device 16 connected to the high speed backplane 14 use a compatible bus protocol. The bus 44 may be administered or managed by an outside bus entity or by an off network entity.

While the principles of the invention have been described above in connection with a specific apparatus, it is to be clearly understood that this description is made only by way of example and not as a limitation on the scope of the invention.

What is claimed is:

1. An electronic connection retrofit system, comprising:
   a chassis having at least one tray receiving port, opposed, generally linearly extending guides adapted to slidably receive and support a tray for an electronic device in said at least one tray receiving port, and a mechanical coupling formed from a preexisting electrical connector;
   a high speed backplane positioned on the chassis;
   a backplane electrical connector electrically attached to the high speed backplane;
   wherein the tray supporting an electrical device and a tray electrical connector that is electrically connected to the electrical device, wherein the tray is slidably insertable into the guides and engageable with the mechanical coupling upon insertion to align the tray electrical connector to electrically engage the backplane electrical connector when the tray is fully engaged with the at least one tray receiving port to establish electrical communication between the electrical device and the high speed backplane;
   wherein the mechanical coupling provides a structural connection to the tray that prevents the slidable removal of said tray from said guides once the tray is engaged to the coupling;
   wherein the backplane electrical connector is attached to the mechanical coupling and the high speed backplane is physically connected to the backplane electrical connector such that the high speed backplane is supported on the chassis by the backplane electrical connector; and wherein the structural connection to the tray comprises a strain relief clip.

2. The electronic connection retrofit system of claim 1, wherein the tray comprises a tray mechanical connector that is engageable with the mechanical coupling.

3. The electronic connection retrofit system of claim 1, further comprising a controller electronically attached to the high speed backplane.

4. The electronic connection retrofit system of claim 3, wherein the controller is a BUS controller.

5. The electronic connection retrofit system of claim 1, wherein the backplane electrical connector is secured to the mechanical coupling via an adhesive.

6. The electronic connection retrofit system of claim 1, wherein the backplane electrical connector is secured to the mechanical coupling via a clip.

7. The electronic connection retrofit system of claim 1, wherein the backplane electrical connector is secured on the mechanical coupling via a fastener.

8. The electronic connection retrofit system of claim 1, wherein the backplane electrical connector is disposed on the mechanical coupling and secured to the chassis.

9. An electronic connection system, comprising:
   a chassis having at least one tray receiving port, opposed, generally linearly extending guides adapted to slidably receive and support a tray for an electronic device in the at least one tray receiving port, and a mechanical coupling;
   a high speed backplane positioned on the chassis;
   a backplane electrical connector electrically attached to the high speed backplane;
   wherein the tray supporting an electrical device and a tray electrical connector that is electrically connected to the electrical device, wherein the tray is slidably insertable into the guides and engageable with the mechanical coupling to align the tray electrical connector to electrically engage the backplane electrical connector when the tray is fully engaged with the at least one tray receiving port to establish electrical communication between the electrical device and the high speed backplane, the mechanical coupling providing a structural connection to the tray and preventing slidable removal of the tray from the guides once the tray is engaged to the coupling; and wherein the structural connection to the tray comprises a strain relief clip.

10. The electronic connection system of claim 9, wherein the backplane electrical connector is attached to the mechanical coupling and the high speed backplane is physically connected to the backplane electrical connector such that the high speed backplane is supported on the chassis by the backplane electrical connector.

11. The electronic connection system of claim 9, wherein the tray comprises a tray mechanical connector that is engageable with the mechanical coupling.

12. The electronic connection system of claim 9, further comprising a controller electronically attached to the high speed backplane.

13. The electronic connection system of claim 12, wherein the controller is a BUS controller.

14. The electronic connection system of claim 9, wherein the backplane electrical connector is secured to the mechanical coupling via an adhesive.

15. The electronic connection system of claim 9, wherein the backplane electrical connector is secured to the mechanical coupling via a clip.

16. The electronic connection system of claim 9, wherein the backplane electrical connector is secured on the mechanical coupling via a fastener.

17. The electronic connection system of claim 9, wherein the backplane electrical connector is disposed on the mechanical coupling and secured to the chassis.

* * * * *